United States Patent
Izumi (10) Patent No.: US 10,065,840 B2
(45) Date of Patent: Sep. 4, 2018

(54) TRANSPORT VEHICLE AND TRANSPORT VEHICLE SYSTEM

(71) Applicant: MURATA MACHINERY, LTD., Kyoto-shi, Kyoto (JP)

(72) Inventor: Takanori Izumi, Inuyama (JP)

(73) Assignee: MURATA MACHINERY, LTD., Kyoto (JP)

(*) Notice: Subject to any disclaimer, the term of this patent is extended or adjusted under 35 U.S.C. 154(b) by 324 days.

(21) Appl. No.: 15/068,982

(22) Filed: Mar. 14, 2016

(65) Prior Publication Data
US 2016/0272468 A1     Sep. 22, 2016

(30) Foreign Application Priority Data
Mar. 19, 2015  (JP) .................................. 2015-056365

(51) Int. Cl.
*B66C 7/12* (2006.01)
*B66C 7/02* (2006.01)
(Continued)

(52) U.S. Cl.
CPC .................. *B66C 7/12* (2013.01); *B66C 7/02* (2013.01); *B66C 9/02* (2013.01); *B66C 9/04* (2013.01); *H01L 21/67733* (2013.01)

(58) Field of Classification Search
CPC ........... E05D 15/0613; E05Y 2900/142; H01L 21/67733; H01L 21/67715; B66C 7/02; B66C 7/12; B66C 9/02; B66C 9/04
(Continued)

(56) References Cited

U.S. PATENT DOCUMENTS 1,889,112 A * 11/1932 Shoemaker ......... E05D 15/0613
                                              105/155
3,708,916 A *  1/1973 Karp, Jr. ............. E05D 15/0613
                                              104/105
(Continued)

FOREIGN PATENT DOCUMENTS

JP      69-38176 A    3/1984
JP      69-145879 A   8/1984
(Continued)

*Primary Examiner* — Mark T Le
(74) *Attorney, Agent, or Firm* — Keating & Bennett, LLP (57) ABSTRACT

A transport vehicle travels on first and second paths orthogonally or diagonally crossing each other and each including an opening at a center and treads on both sides of the opening. The transport vehicle includes a vehicle in an upper portion; a transport in a lower portion to hold an article; and a column extending downward from the vehicle to the transport. The vehicle includes on front and rear of the column along the first path, at least a pair of first traveling units each including a first traveling wheel that travels on the tread of the first path, and first auxiliary wheels on front and rear of the first traveling wheel along the first path; on front and rear of the column along the second path, at least a pair of second traveling units each including a second traveling wheel that travels on the tread of the second path, and second auxiliary wheels on front and rear of the second traveling wheel along the second path; and a lifting mechanism that raises and lowers one of the at least the pair of first traveling units and the at least the pair of second traveling units.

6 Claims, 7 Drawing Sheets

(51) Int. Cl.
*B66C 9/02* (2006.01)
*B66C 9/04* (2006.01)
*H01L 21/677* (2006.01)

(58) Field of Classification Search
USPC .......................................... 104/96, 104, 105
See application file for complete search history.

(56) References Cited

U.S. PATENT DOCUMENTS

| | | | | | |
|---|---|---|---|---|---|
| 3,843,995 | A | * | 10/1974 | Merrill | B60B 33/00 |
| | | | | | 16/102 |
| 4,555,828 | A | * | 12/1985 | Matimura | E04B 2/827 |
| | | | | | 104/105 |
| 4,752,987 | A | * | 6/1988 | Dreyer | E05D 15/0613 |
| | | | | | 104/94 |
| 5,295,281 | A | * | 3/1994 | Kordes | E05D 15/0613 |
| | | | | | 16/104 |
| 8,607,709 | B2 | * | 12/2013 | Lee | B66C 11/14 |
| | | | | | 104/105 |
| 2013/0213755 | A1 | | 8/2013 | Shibata et al. | |
| 2017/0240356 | A1 | * | 8/2017 | Benedict | B65G 1/0464 |

FOREIGN PATENT DOCUMENTS

| | | | |
|---|---|---|---|
| JP | 60-93562 U | 6/1985 |
| JP | 2-42717 B2 | 9/1990 |
| JP | 6-270405 A | 10/1993 |
| JP | 2764561 B2 | 6/1998 |
| JP | 3995583 B2 | 10/2007 |
| JP | 2012-40961 A | 3/2012 |
| JP | 2012-162096 A | 8/2012 |

* cited by examiner

TRANSPORT VEHICLE AND TRANSPORT VEHICLE SYSTEM

BACKGROUND OF THE INVENTION

1. Field of the Invention

The present invention relates to a transport vehicle and a transport vehicle system.

2. Description of the Related Art

An overhead traveling vehicle system has been used for transport in a clean room or the like. JP2012-162096A describes that a branching portion and a merging portion are provided on a traveling route. JP2012-40961A describes that traveling routes for an overhead traveling vehicle are made to cross each other longitudinally and transversely. However, in JP2012-40961A, since a rail is mechanically rotated in a crossing portion of the cross, the overhead traveling vehicle cannot autonomously change a traveling direction.

When the transport vehicle is enabled to travel while autonomously changing directions of longitudinal and transverse paths, it is possible to provide a large number of crossing portion of the cross of the paths. This allows dense arrangement of the paths, and also allows free layout of the path. Hence the transport vehicle has more options for traveling routes, and can select a traveling route so as to detour around a congested portion and the like and reach a destination via a short distance. Further, when an opening is provided at the center of the path with treads provided on both sides of the opening, and a transport is supported by a column passing through the opening, it is possible to realize a suspension type transport vehicle and exchange an article with a location immediately below the path.

However, this requires a mechanism in which the transport vehicle can safely travel through the opening formed in the crossing portion of the paths, and the transport vehicle autonomously and reliably switches between longitudinal traveling and transverse traveling.

SUMMARY OF THE INVENTION

Preferred embodiments of the present invention provide a transport vehicle capable of autonomously traveling in a suspended manner on longitudinal and transverse paths, and a system for the transport vehicle.

According to a preferred embodiment of the present invention, a transport vehicle travels on a first path and a second path orthogonally or diagonally crossing each other, the first path and the second path each including an opening at a center and treads on both sides of the opening. The transport vehicle preferably includes: a vehicle in an upper portion; a transport in a lower portion to hold an article; and a column extending downward from the vehicle to the transport. The vehicle includes: on a front and a rear of the column along the first path, at least a pair of first traveling units each including a first traveling wheel that travels on the tread of the first path, and first auxiliary wheels on front and rear of the first traveling wheel along the first path; on front and rear of the column along the second path, at least a pair of second traveling units each including a second traveling wheel that travels on the tread of the second path, and second auxiliary wheels on front and rear of the second traveling wheel along the second path; and a lifting mechanism that raises and lowers one of the at least the pair of first traveling units and the at least the pair of second traveling units.

A transport vehicle system according to another preferred embodiment of the present invention includes: a traveling path including a first path including an opening at a center thereof and treads on both sides of the opening, and a second path including an opening at a center thereof and treads on both sides of the opening, the second path orthogonally or diagonally crossing the first path; and a transport vehicle including a vehicle which travels on the first path and the second path and is located in an upper portion, a transport which holds an article and is located in a lower portion, and a column which extends downward from the vehicle to the transport through the opening. The vehicle includes: on a front and a rear of the column along the first path, at least a pair of first traveling units each including a first traveling wheel that travels on the tread of the first path, and first auxiliary wheels on front and rear of the first traveling wheel along the first path; on front and rear of the column along the second path, at least a pair of second traveling units each including a second traveling wheel that travels on the tread of the second path, and second auxiliary wheels on front and rear of the second traveling wheel along the second path; and a lifting mechanism that raises and lowers one of the at least the pair of first traveling units and the at least the pair of second traveling units.

In various preferred embodiments of the present invention, the traveling units on the front and the rear of the column or the traveling units on the right and the left thereof are supported by the paths, and the front and rear traveling units and the right and left traveling units are switched by the lifting mechanism. The lifting mechanism may, for example, raise one of the front and rear traveling units and the right and left traveling units, and lower the other thereof. Further, the lifting mechanism may raise and lower only one of the front and rear traveling units and the right and left traveling units, and fix the other thereof. Each of the traveling units includes the auxiliary wheels on the front and the rear of the traveling wheel, and the traveling unit is supported by the front and rear auxiliary wheels while the traveling wheel passes through the opening. This allows stable passing of the transport vehicle through the opening, and support of the transport by the column passing through the opening. The first path and the second path are able to be freely arranged longitudinally and transversely, thus leading to high flexibility in path arrangement. Further, this allows dense arrangement of the first path and the second path. The transport vehicle is able to exchange an article with a location immediately below the first path, a location immediately below the second path, and the like.

It is preferable that each of the at least the pair of first traveling units further include at least two guide rollers, which are located within the opening at the center of the first path and located in different positions from the center of the opening along a direction perpendicular or substantially perpendicular to a direction of the first path within a horizontal plane, and a first expansion/reduction mechanism that expands and reduces a space between the at least two guide rollers, each of the at least the pair of second traveling units further include at least two guide rollers, which are located within the opening at the center of the second path and located in different positions from the center of the opening along a direction perpendicular to a direction of the second path within the horizontal plane, and a second expansion/reduction mechanism that expands and reduces a space between the at least two guide rollers, and the space between the guide rollers of the lowered-side traveling unit out of the first traveling unit and the second traveling unit are expanded. By expanding the space between the guide rollers of the lowered-side traveling unit, the guide roller is guided by a guide surface such as a side surface of the path facing the opening, and by reducing the space between the guide rollers, the guide roller is able to be raised while avoiding sliding on the guide surface.

It is preferable that an interval between a wheel shaft of the first traveling wheel and a wheel shaft of each of the first auxiliary wheels on the front and the rear of the first traveling wheel is larger than a width of the opening in the second traveling path, and an interval between a wheel shaft of the second traveling wheel and a wheel shaft of each of the second auxiliary wheels on the front and the rear of the second traveling wheel is larger than a width of the opening in the first traveling path. In this manner, when the first traveling wheel passes through the opening, the first auxiliary wheels on the front and the rear of the first traveling wheel are supported by the treads, and when the second traveling wheel passes through the opening, the second auxiliary wheels on the front and the rear of the second traveling wheel are supported by the treads. This allows more stable traveling through the opening.

It is preferable that the first traveling units and the second traveling units are arranged to define a cross with the column at a center. In this manner, a load applied from the transport to the vehicle via the column is able to be stably supported, and the traveling units are present on the front and the rear and the right and the left of the crossing portion of the cross, thus allowing a traveling direction to be reliably changed.

It is preferable that the first traveling wheel and the second traveling wheel are driving wheels, and the first auxiliary wheels and the second auxiliary wheels are driven wheels, the first traveling wheel and each of the first auxiliary wheels are located in different positions in a direction of a short side of the first path along the tread, the second traveling wheel and each of the second auxiliary wheels are located in different positions in a direction of a short side of the second path along the tread, and a groove is provided in a position facing the first auxiliary wheel on the tread of the first path and a groove is provided in a position facing the second auxiliary wheel on the tread of the second path in a range other than a predetermined range from the crossing portion of the cross where the first path and the second path cross each other such that the first auxiliary wheel comes into contact with the tread of the first path and the second auxiliary wheel comes into contact with the tread of the second path in the predetermined range, and the first auxiliary wheel and the second auxiliary wheel are spaced away from the treads in the other range. When the traveling wheel and the auxiliary wheel both come into contact with the tread, the load applied to the traveling wheel that is the driving wheel decreases, to limit acceleration performance. When a groove is provided on the tread in a portion away from a periphery of the crossing portion of the cross and the auxiliary wheel is away from the tread, there is no limit generated on the acceleration performance. Note that a groove only has to be on the tread in most of the portion spaced away from the periphery of the crossing portion of the cross, and a portion without a groove may partly exist.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described. The scope of the present invention is to be set in accordance with understanding of a person skilled in the art, taking into consideration the description in the specification and the known techniques in this field.

Figure 1:
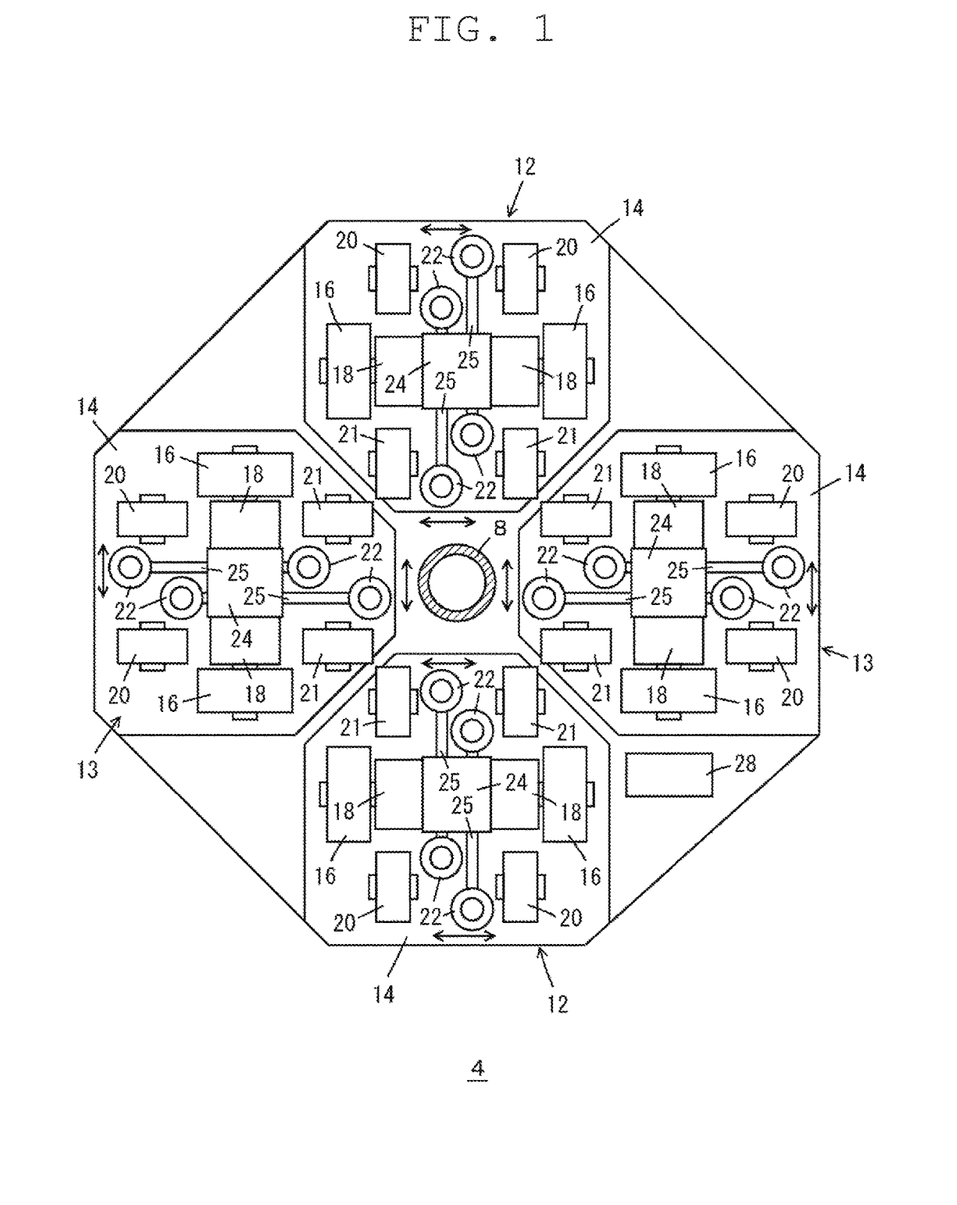
FIG. 1 illustrates a bottom view of a main portion of a transport vehicle according to a preferred embodiment of the present invention.
Figure 2:
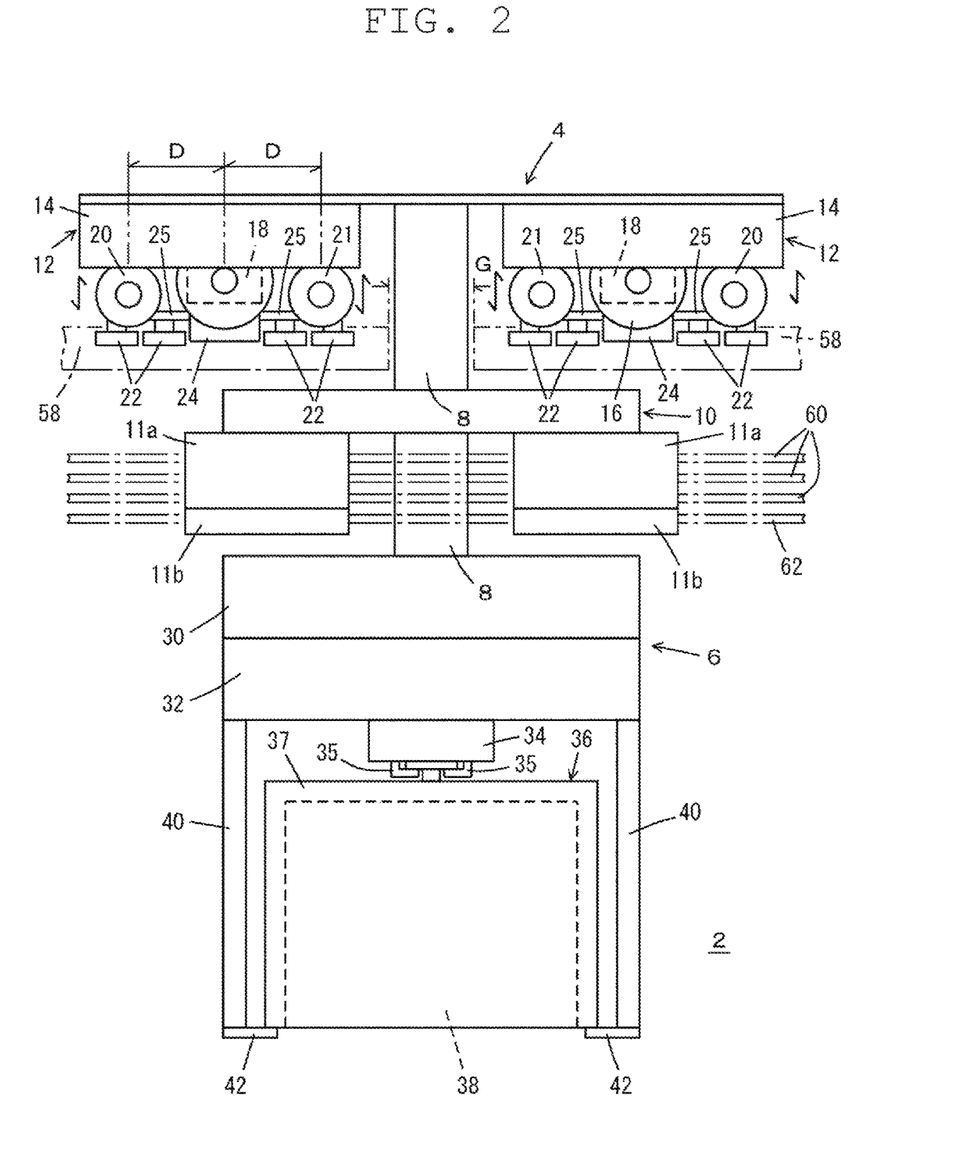
FIG. 2 illustrates a side view of the transport vehicle according to a preferred embodiment of the present invention.
Figure 3:
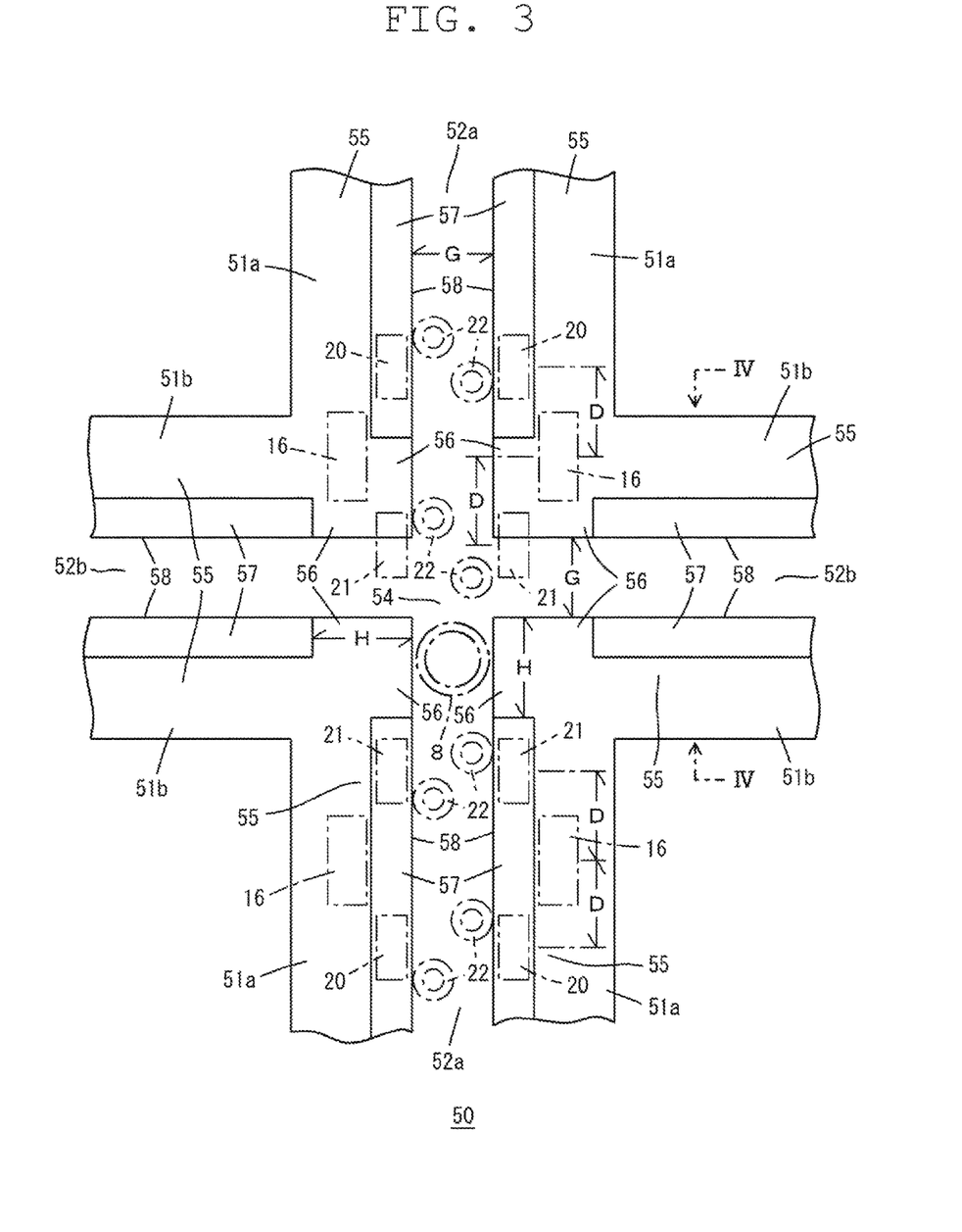
FIG. 3 is a plan view of a traveling path according to a preferred embodiment of the present invention.
Figure 4:
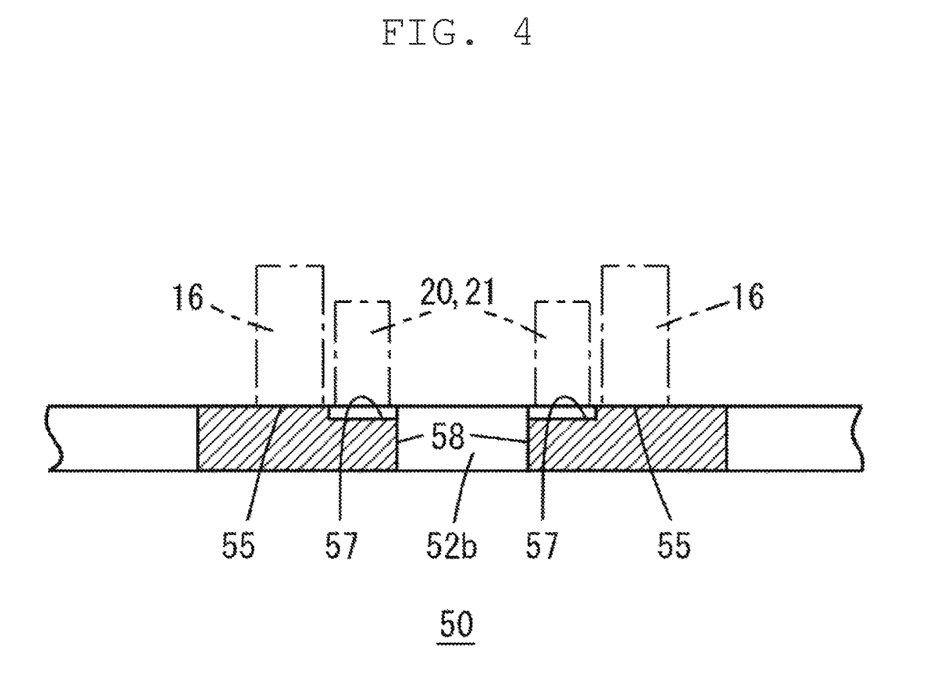
FIG. 4 is a sectional view in a direction IV-IV of FIG. 3.

FIGS. 1 to 7 illustrate a transport vehicle 2 and a transport vehicle system according to a preferred embodiment of the present invention. FIG. 2 illustrates the transport vehicle 2 by a solid line, and a traveling path 50 by a chain line. FIGS. 3 and 4 illustrate a traveling path 50 by a solid line and the transport vehicle 2 by a chain line. The transport vehicle 2 preferably is a suspension-traveling type transport vehicle including a vehicle 4 that travels on the traveling path 50, and a transport 6 that is suspended from the vehicle 4 via a column 8 and moves below the traveling path 50. A power receiver 10 is provided between the vehicle 4 and the transport 6. The power receiver 10 receives power from a magnetic core 11a in a non-contact manner through a litz wire 60, and communicates with equipment on the ground side (not illustrated) by a communicator 11b through a communication line 62. If a secondary battery, a capacitor, or the like is mounted and the transport vehicle 2 is charged by the secondary battery, the capacitor, or the like when the transport vehicle 2 stops, the power receiver 10 may not be provided. Further, the vehicle 4 and the transport 6 may not be fixed to the column 8, and one of the vehicle 4 and the transport 6 may rotate around the column 8.

The vehicle 4 includes a pair of front and rear traveling units 12, 12 in a longitudinal direction, and a pair of right and left traveling units 13, 13 in a transverse direction. The traveling units 12, 13 preferably have the same structure, and the column 8 is located at the center of the vehicle 4. Each of the traveling units 12, 13 includes an elevator 14, which preferably is defined by a known lifting mechanism such as a pantograph, a cam, and a ball screw. A pair of driving wheels 16 are provided at the center of the bottom of each of the traveling units 12, 13. On both sides of the driving wheels 16, pairs of auxiliary wheels 20, 21 are provided. Further, on both sides of the driving wheels 16, pairs of guide rollers 22 are provided. The driving wheel 16 is driven by a traveling driver 18 defined by a motor, a decelerator, and the like. The auxiliary wheels 20, 21 are driven wheels. The guide rollers 22 are attached to a pair of bars 25, 25. An expansion/reduction mechanism 24 is defined by a cam, a four-joint link, and the like, and expands and reduces a space between the bars 25, 25. Note that the driving wheel 16 may be made a driven wheel, and another driving wheel may be provided. Further, the elevator 14 raises and lowers the members necessary to travel from the driving wheel 16 to the bar 25, with a stroke of approximately 20 mm, for example.

The transport 6 includes a rotation mechanism 30, a hoist 32, and a lifting stage 34, and holds and transports an article 36. The rotation mechanism 30 rotates the hoist 32 about a vertical axis. It is particularly preferable to rotate the orientation of the article 36 by 180 degrees with the rotation of the hoist 32 by ±180 degrees, and to align the orientation of the article 36 with a load port, a buffer, and the like with the rotation of the hoist 32 by approximately ±10 degrees. The hoist 32 raises the lifting stage 34 by a belt or the like, and the lifting stage 34 holds a top portion of the article 36 by a chuck 35. The article 36 is, for example, a FOUP (Front Opening Unified Pod) including a door 37 and a body 38 to house semiconductor wafers, and has a certain orientation. Hence the rotation mechanism 30 adjusts the orientation of the article 36. Note that a rotation mechanism may be provided on the lifting stage 34 to rotate the article 36. The transport 6 includes a pair of covers 40, 40, for example. A pair of freely advancing supports 42 advances from the bottoms of the covers 40, 40 onto the bottom of the article 36, to prevent falling of the article 36. Note that the transported article 36 is not limited to the FOUP, and may be any article. The transport 6 may include a transverse feed mechanism, so that the rotation mechanism 30 and the like can be fed transversely from a position immediately below the traveling path 50 to a position away from the traveling path 50.

The transport vehicle 2 includes a controller 28, to control the vehicle 4 and the transport 6, and communicate with the equipment on the ground side, the other transport vehicles 2, or communicate additionally with an overhead traveling vehicle 70 described below. The transport 6 holds the article 36 by the hoist while raising and lowering the article 36. However, the transport 6 may at least hold and transport the article 36. The traveling units 12, 13 are in a state where one of the traveling units 12, 13 is lowered to travel and the other is raised to retreat. On the lowered side, the space between the bars is increased so that the guide roller 22 is guided. On the raised side, the space between the bars 25 is reduced so that the guide rollers 22 are prepared to be inserted into an opening 52 to be described later.

The traveling path 50 is preferably constructed by arranging a longitudinal path 51a and a transverse path 51b in a lattice shape longitudinally and transversely within a horizontal plane, for example. The paths 51a, 51b respectively include pairs of paths and openings 52a, 52b between the paths. Although the paths 51a, 51b are longitudinally and transversely orthogonal to each other, the paths 51a, 51b may diagonally cross each other. Further, it is preferable to provide a cover on the traveling path 50 to prevent dust from being emitted outside, illustration of the cover is omitted. The openings 52a, 52b cross each other in the crossing portion of the cross 54, and the transport vehicle 2 can change its traveling direction between the longitudinal direction and the transverse direction in the crossing portion of the cross 54. The paths 51a, 51b each include pairs of treads 55 on both sides of the openings 52a, 52b, and the driving wheel 16 of the transport vehicle 2 travels thereon. Auxiliary treads 56 are provided on the front and the rear and the right and left of the crossing portion of the cross 54, and the auxiliary wheels 20, 21 travel thereon. When the auxiliary wheels 20, 21 constantly come into contact with the paths 51a, 51b, a load applied to the driving wheel 16 decreases, to limit acceleration and deceleration. Hence, in a position spaced away from the crossing portion of the cross 54, grooves 57 are provided in the paths 51a, 51b, so as to prevent the auxiliary wheels 20, 21 from coming into contact with the paths 51a, 51b. The surfaces of the paths 51a, 51b on the side of the openings 52a, 52b define guide surfaces 58, to guide the guide rollers. Note that the groove 57 may not be provided. Further, the guide roller 22 may not be provided, and a flange may be provided on the driving wheel 16 or the like and guided by a guide surface (not illustrated) provided on each of the paths 51a, 51b.

One of the traveling units 12, 13 is lowered to a height at which it comes into contact with one of the paths 51a, 51b. The other traveling unit is raised, and particularly the guide roller 22 is at a position higher than the other of the paths 51a, 51b. A width of each of the openings 52a, 52b (a gap between the paths 51a, 51a, and the like) is referred to as G, an interval between wheel shafts of the driving wheel 16 and each of the auxiliary wheels 20, 21 is referred to as D, and a length of the auxiliary tread 56 is referred to as H. The gap G is larger than a diameter of the column 8, and the crossing portion of the cross 54 is, for example, a square with one side being G. Here, "H >D >G" is assumed. With "H >D >G", when the driving wheel 16 is in the crossing portion of the cross 54 in each one of the traveling units 12, 13, the auxiliary wheels 20, 21 on both sides of the driving wheel 16 come into contact with the auxiliary tread 56, to stably support each of the traveling units 12, 13.

The guide roller 22 is pressed onto the guide surface 58 by the expansion/reduction mechanism 24. Each one or more pairs of guide rollers 22 are provided in the front and the rear for each of the traveling units 12, 13, and thus, any pair of guide rollers 22 comes into contact with the guide surfaces 58 in the vicinity of the crossing portion of the cross 54, to guide each of the traveling units 12, 13.

One of the traveling units 12, 13 is lowered to a height at which it comes into contact with the paths 51a, 51b, and the lowered-side traveling unit travels by means of the front and rear driving wheels 16, 16 and is guided by the guide rollers 22. Then, the groove 57 prevents the auxiliary wheels 20, 21 from coming into contact with each of the paths 51a, 51b. The other traveling unit is raised, and the space between the guide rollers is reduced, for example.

Figure 5:
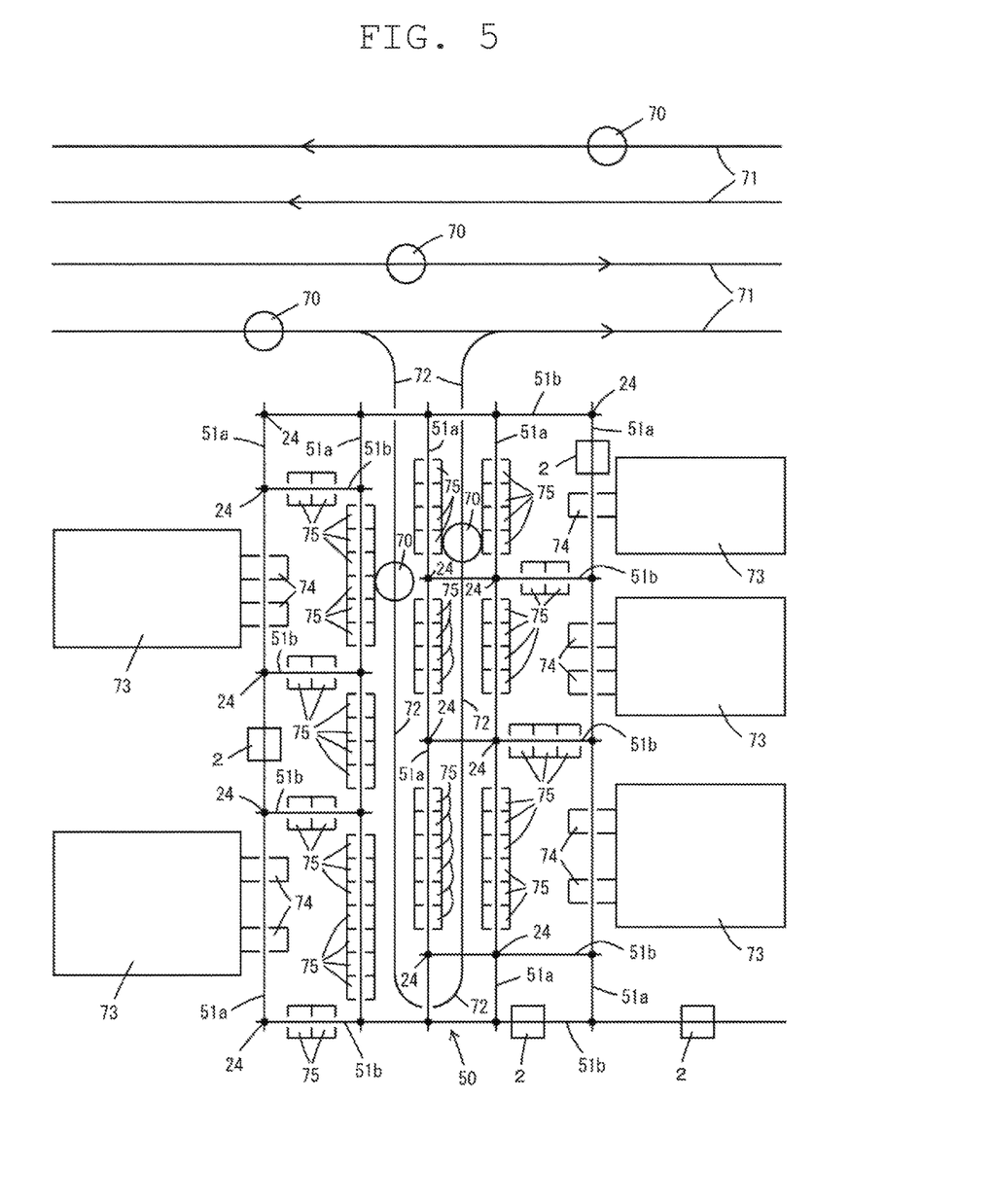
FIG. 5 is a plan view illustrating a layout of a transport vehicle system according to a preferred embodiment of the present invention.
Figure 6:
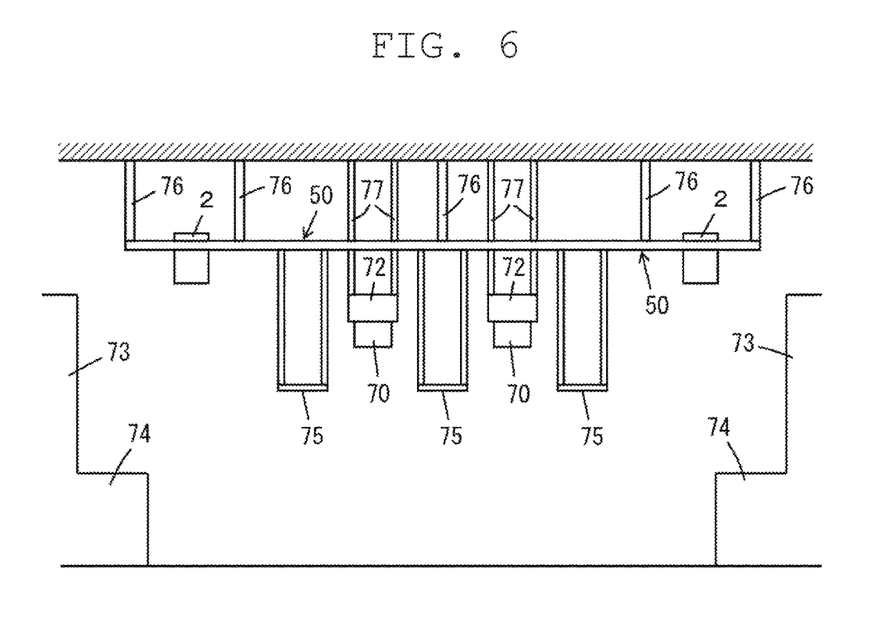
FIG. 6 is a front view illustrating the layout of a transport vehicle system according to a preferred embodiment of the present invention.

FIGS. 5 and 6 illustrate a layout in which a transport vehicle system is installed in a bay in a clean room, along with an overhead traveling vehicle system. Reference numeral 70 denotes an overhead traveling vehicle, 71 denotes an inter-bay route for the overhead traveling vehicle 70, and 72 denotes an intra-bay route for the overhead traveling vehicle 70. Reference numeral 73 denotes a processing device for a semiconductor and the like, and 74 denotes its load port, which is a port that takes the article 36 into and out of the processing device 73. For example, the traveling path 50 is arranged on an upper stage, the intra-bay route 72 is arranged on a middle stage, and a buffer 75 is arranged on a lower stage, and below any of these, the load port 74 is arranged. Note that the intra-bay route 72 may be arranged above the traveling path 50. Then, the heights of the intra-bay route 72 and the traveling path 50 are changed, to avoid interference between the overhead traveling vehicle 70 and the transport vehicle 2.

The overhead traveling vehicle 70 includes a hoist and a transverse feed mechanism, and loads and unloads an article to and from the buffer 75. The transport vehicle 2 transports the article between the buffer 75 and the load port 74. The traveling path 50 is not required to be arranged regularly as in the form of a chessboard or the like as illustrated in FIG. 5, and thus layout of the traveling paths 50 is highly flexible. Further, even at a junction of three paths of the traveling path 50 or in a position where the traveling path 50 is curved at a right angle, as illustrated in an intersection 24 of FIG. 3, the paths 51a, 51b are arranged on four longitudinal and transverse sides thereof, so as to allow the transport vehicle 2 to change its direction.

The transport vehicle 2 can change its direction at each crossing portion of the cross 54, retreat or detour, freely select a traveling route, and is unlikely to be congested in the traveling route. Further, since the direction of the path is not changed by a curve as on the intra-bay route 72, the traveling paths 50 are able to be densely arranged. This also allows a large number of buffers 75 to be densely arranged.

Figure 7:
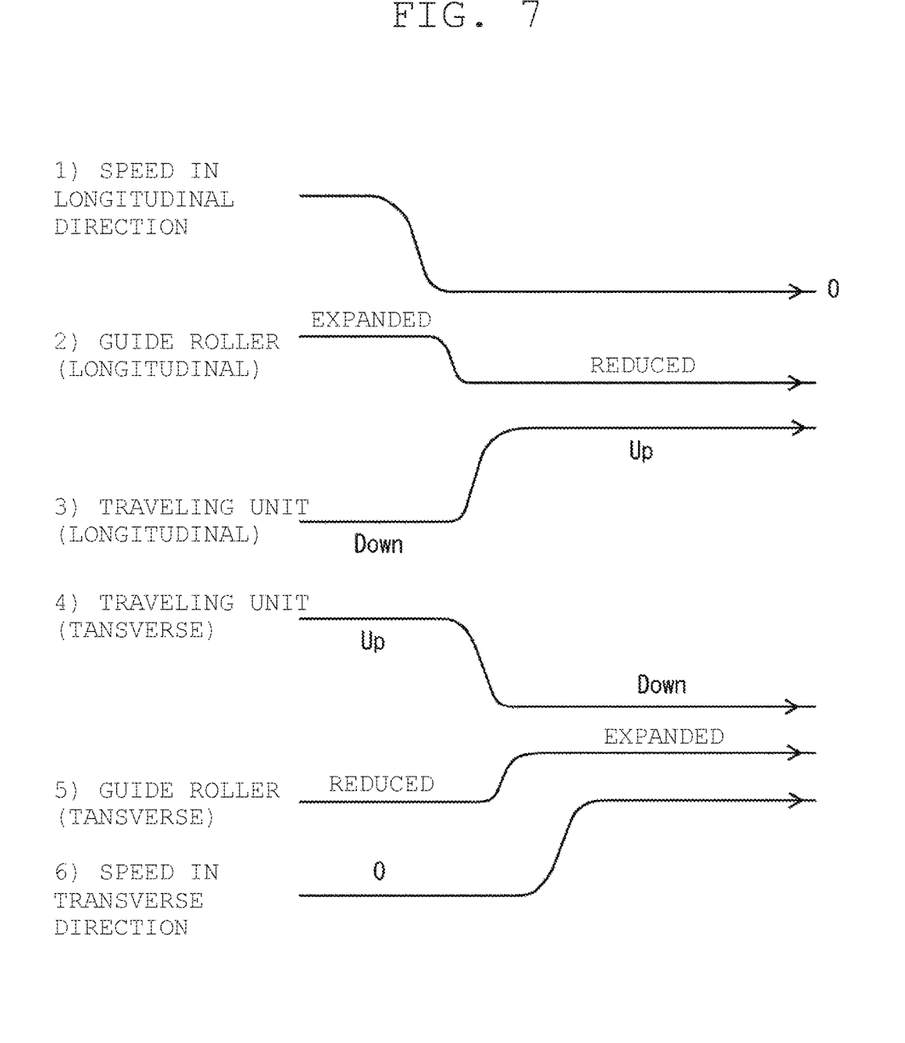
FIG. 7 is a timing chart illustrating switching of a traveling direction in a preferred embodiment of the present invention, where 1) illustrates a traveling speed in a longitudinal direction, 2) illustrates expansion and reduction of a space between guide rollers in the longitudinal direction, 3) illustrates raising and lowering of a traveling unit in the longitudinal direction, 4) illustrates raising and lowering of the traveling unit in a transverse direction, 5) illustrates expansion and reduction of a space between guide rollers in the transverse direction, and 6) illustrates a traveling speed in the transverse direction.

FIG. 7 illustrates the change of the direction at the intersection 24 by taking as an example a change from longitudinal traveling to transverse traveling in a plan view. The transport vehicle 2 decelerates before the intersection 24, and stops so that the column 8 is in the central portion of the intersection 24. Each of the longitudinal traveling units 12, 12 reduces the space between the guide rollers 22, 22 after being stopped, for example, and the traveling units 12, 12 are raised. For example, simultaneously with the raising of the traveling units 12, 12, the transverse traveling units 13, 13 are lowered, and the space between the guide rollers 22, 22 is expanded after the lowering, for example. When the lowering of the traveling units 13, 13 is completed and the space is expanded to such a position where the guide rollers 22 are guided by the guide surfaces 58, traveling by the transverse traveling units 13, 13 is started.

Note that, when the direction is to be changed more carefully, the following is preferably performed. After traveling has been stopped, the traveling unit on the subsequently traveling side is lowered, and the space between the guide rollers is then expanded. Thereafter, the space between the guide rollers on the stopped side is reduced, and the traveling unit is finally raised. Further, when the direction is not to be changed, the transport vehicle may pass through the crossing portion of the cross 54 without decelerating, for example, without switching of the traveling units 12, 13 and switching of the guide roller 22 by the expansion/reduction mechanism 24. Then, in a position where the driving wheel 16 is spaced away from a tread 55, the front and rear auxiliary wheels 20, 21 support each of the traveling units 12, 13 and either the front guide roller 22 or the rear guide roller 22 is being guided by the guide surface 58, thus allowing stable traveling in the crossing portion of the cross 54.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transport vehicle which travels on a first path and a second path orthogonally or diagonally crossing each other, the first path including a first opening at a center of the first path and first treads on both sides of the first opening, and the second path including a second opening at a center of the second path and second treads on both sides of the second opening, the transport vehicle comprising:
    a vehicle in an upper portion of the transport vehicle;
    a transport in a lower portion of the transport vehicle to hold an article; and
    a column extending downward from the vehicle to the transport; wherein
    the vehicle includes:
        on a front and a rear of the column along the first path, at least a pair of first traveling units each including a first traveling wheel that travels on a tread included in the first treads of the first path, and first auxiliary wheels on a front and a rear of the first traveling wheel along the first path;
        on a front and a rear of the column along the second path, at least a pair of second traveling units each including a second traveling wheel that travels on a tread included in the second treads of the second path, and second auxiliary wheels on a front and a rear of the second traveling wheel along the second path; and
        an elevator that raises and lowers one of the at least the pair of first traveling units and the at least the pair of second traveling units.

2. The transport vehicle according to claim 1, wherein each of the at least the pair of first traveling units further includes at least two guide rollers, which are located within the first opening at the center of the first path and located in different positions from the center of the first opening along a direction perpendicular or substantially perpendicular to a direction of the first path within a horizontal plane, and a first expansion/reduction mechanism that includes a first cam and a first linkage and expands and reduces a space between the at least two guide rollers;
    each of the at least the pair of second traveling units further includes at least two guide rollers, which are located within the second opening at the center of the second path and located in different positions from the center of the second opening along a direction perpendicular or substantially perpendicular to a direction of the second path within the horizontal plane, and a second expansion/reduction mechanism that includes a second cam and a second linkage and expands and reduces a space between the at least two guide rollers; and
    the space between the guide rollers of either of the first traveling unit and the second traveling unit that is lowered by the elevator is expanded.

3. The transport vehicle according to claim 1, wherein an interval between a wheel shaft of the first traveling wheel and a wheel shaft of each of the first auxiliary wheels on the front and the rear of the first traveling wheel is larger than a width of the second opening in the second path; and
    an interval between a wheel shaft of the second traveling wheel and a wheel shaft of each of the second auxiliary wheels on the front and the rear of the second traveling wheel is larger than a width of the first opening in the first path.

4. The transport vehicle according to claim 1, wherein the first traveling units and the second traveling units are arranged in a cross structure with the column located at a center of the cross structure.

5. A transport vehicle system, comprising:
    a traveling path including a first path including a first opening at a center thereof and first treads on both sides of the first opening, and a second path including a second opening at a center thereof and second treads on both sides of the second opening, the second path orthogonally or diagonally crossing the first path; and a transport vehicle including a vehicle which travels on the first path and the second path and is located in an upper portion of the transport vehicle, a transport which holds an article and is located in a lower portion of the transport vehicle, and a column which extends downward from the vehicle to the transport through the first opening and the second opening; wherein the vehicle includes:
  on a front and a rear of the column along the first path, at least a pair of first traveling units each including a first traveling wheel that travels on a tread included in the first treads of the first path, and first auxiliary wheels on a front and a rear of the first traveling wheel along the first path;
  on a front and a rear of the column along the second path, at least a pair of second traveling units each including a second traveling wheel that travels on a tread included in the second treads of the second path, and second auxiliary wheels on a front and a rear of the second traveling wheel along the second path; and
  an elevator that raises and lowers one of the at least the pair of first traveling units and the at least the pair of second traveling units.

6. The transport vehicle system according to claim 5, wherein
  the first traveling wheel and the second traveling wheel are driving wheels, and the first auxiliary wheels and the second auxiliary wheels are driven wheels;
  the first traveling wheel and each of the first auxiliary wheels are located in different positions in a direction of a short side of the first path along the first treads of the first path;
  the second traveling wheel and each of the second auxiliary wheels are located in different positions in a direction of a short side of the second path along the second treads of the second path; and
  a groove is provided in a position facing each of the first auxiliary wheels on one of the first treads of the first path and a groove is provided in a position facing each of the second auxiliary wheels on one of the second treads of the second path in a range other than a predetermined range from a crossing portion of a cross where the first path and the second path cross each other such that the first auxiliary wheels come into contact with the first treads of the first path and the second auxiliary wheels come into contact with the second treads of the second path in the predetermined range, and the first auxiliary wheels and the second auxiliary wheels are away from the first treads and the second treads in the other range.

* * * * *